United States Patent
Ueda et al.

(10) Patent No.: US 7,459,377 B2
(45) Date of Patent: Dec. 2, 2008

(54) METHOD FOR DIVIDING SUBSTRATE

(75) Inventors: Tetsuzo Ueda, Toyonaka (JP); Daisuke Ueda, Ibaraki (JP)

(73) Assignee: Panasonic Corporation, Osaka (JP)

( * ) Notice: Subject to any disclaimer, the term of this patent is extended or adjusted under 35 U.S.C. 154(b) by 80 days.

(21) Appl. No.: 11/146,020

(22) Filed: Jun. 7, 2005

(65) Prior Publication Data
US 2005/0272224 A1 Dec. 8, 2005

(30) Foreign Application Priority Data
Jun. 8, 2004 (JP) .............................. 2004-169731

(51) Int. Cl.
H01L 21/44 (2006.01)
(52) U.S. Cl. ...................... 438/462; 438/461; 438/460; 438/113
(58) Field of Classification Search .................. 438/33, 438/113, 460–463, 68
See application file for complete search history.

(56) References Cited

U.S. PATENT DOCUMENTS

| | | | |
|---|---|---|---|
| 6,413,839 B1 * | 7/2002 | Brown et al. | |
| 6,546,034 B2 * | 4/2003 | Komori et al. | |
| 6,683,305 B1 * | 1/2004 | Lu et al. ...................... | 250/307 |
| 6,699,774 B2 * | 3/2004 | Takyu et al. | |
| 6,838,668 B2 * | 1/2005 | Berger et al. ................. | 250/306 |
| 7,005,317 B2 * | 2/2006 | Chin et al. | |
| 7,141,443 B2 * | 11/2006 | Nagai et al. | |
| 2003/0162368 A1 * | 8/2003 | Connell et al. ............... | 438/465 |
| 2004/0020040 A1 * | 2/2004 | Arneson et al. | |
| 2004/0174092 A1 * | 9/2004 | Iwata | |
| 2004/0212047 A1 * | 10/2004 | Joshi et al. | |
| 2005/0003634 A1 * | 1/2005 | Brown et al. | |
| 2005/0029646 A1 | 2/2005 | Ueda et al. | |
| 2005/0087522 A1 * | 4/2005 | Sun et al. | |
| 2005/0103754 A1 * | 5/2005 | Olsen | |
| 2005/0158967 A1 * | 7/2005 | Huang et al. ................. | 438/460 |
| 2005/0263854 A1 * | 12/2005 | Shelton et al. ............... | 257/615 |
| 2006/0121697 A1 * | 6/2006 | Fujii et al. ................... | 438/460 |

FOREIGN PATENT DOCUMENTS

| | | | |
|---|---|---|---|
| JP | 8-236867 | | 9/1996 |
| JP | 10-070335 | * | 3/1998 |
| JP | 10-242570 | | 9/1998 |
| JP | 2003-332273 | | 11/2003 |

OTHER PUBLICATIONS

English Language Abstract of JP 2003-332273.
English Language Abstract of JP 8-236867.
English Language Abstract of JP 10-242570.
Abstract of JP 10-070335.*

* cited by examiner

Primary Examiner—Dung A Le
(74) Attorney, Agent, or Firm—Greenblum & Bernstein, P.L.C.

(57) ABSTRACT

The present invention aims at providing a method for dividing a substrate that is capable of dividing each substrate into chips in the same square-like form without causing chip breaking and capable of forming all cleaved facets flat. In the method for dividing a substrate of the present invention, an electron beam 1 with the intensity that causes a dislocation inside the substrate is irradiated to a substrate surface 2 to generate a crack starting from such dislocation, and a cleaved facet 5 is formed to divide the substrate.

14 Claims, 9 Drawing Sheets

Depth from substrate surface

Straight line: relationship between $W_b$ and $I_b$ under fixed condition $4V_b/\pi d_b^2$ Electron beam current $I_b$

METHOD FOR DIVIDING SUBSTRATE

BACKGROUND OF THE INVENTION (1). Field of the Invention

The present invention relates to a method for dividing a substrate that is applicable to a method for manufacturing, for example, a semiconductor laser element, a light-emitting diode, and a field-effect transistor integrated circuit that are made up of nitride semiconductors.

(2). Description of the Related Art

A GaN-based nitride semiconductor (InGaAlN), which is represented by the composition formula $Al_xGa_{1-x-y}In_yN$ ($0 \leq x \leq 1$, $0 \leq y \leq 1$, $0 \leq z \leq 1$, $0 \leq x+y+z \leq 1$) and has a wide band gap (the band gap width of GaN at room temperature is 3.4 eV), is a material that can realize a high-power light-emitting diode in a wavelength range such as the green/blue visible range and the ultraviolet region. A widely used light-emitting diode realized by InGaAlN is a white light-emitting diode that obtains white light by exciting a fluorescent substance by a blue light-emitting diode. Furthermore, a violet semiconductor laser element using a nitride semiconductor is already in commercial use as a next-generation high-density optical disc light source. Moreover, since a nitride semiconductor has the characteristics of a high saturated drift velocity and a high breakdown voltage, it is considered as a promising material for a high-frequency and high-power electronic device in the future, and research and development on it has been actively conducted.

In general, a method is employed that uses a highly rigid substrate such as a sapphire substrate and a SiC substrate for crystal growth and that epitaxially grows a semiconductor layer on such substrate using the metal organic chemical vapor deposition (DOCVD). Moreover, recent years have seen the development of a GaN substrate that is obtained by forming a thick-film crystal on a base material substrate by the hydride vapor phase epitaxy (HVPE) and then by separating or removing the base material substrate. Furthermore, formation of a device structure on a GaN substrate has also been carried out in recent years. In either cases, it is generally very difficult to perform chip separation since these substrates are highly rigid compared with conventional semiconductor substrates such as a Si substrate and a GaAs substrate. Thus, a generally used method that performs dicing with a diamond blade (e.g., see the Japanese Laid-Open Patent application No. 08-236867 and the Japanese Laid-Open Patent application No. 10-242570) has problems such as frequent occurrence of chip breaking and the difficulty of dicing each substrate into chips in the same square-like form. Meanwhile, in the case of manufacturing a semiconductor laser element, it is necessary to form a resonant mirror by means of cleavage, but it is difficult to make the resulting cleaved facet flat. Conventionally, cleavage or the like has been performed by forming a linear ditch on a sapphire substrate or a SiC substrate using a diamond scriber and then by pressing an edge jig against the substrate. However, since it is difficult by this method to obtain a flat cleaved facet, there is a problem that the threshold current of the resulting semiconductor laser element becomes higher and the process yield becomes worse.

Another example of the case where dicing is difficult is chip separation of a substrate on which a Si large scale integrated circuit (LSI) with a highly rigid, low dielectric insulating film is formed. Development on a Si LSI has been conducted in an accelerated rate for reducing its size down to the deep submicron region as well as for increasing the operation speed of such down-sized Si LSI, but wiring delay is a significant problem for such an LSI. As a solution to this problem, an active attempt has been made to reduce wring delay by reducing the dielectric constant of an insulating film between wires. However, since the material of this low dielectric insulating film is generally very rigid, there is a problem that it is very difficult to perform dicing using a diamond blade for chip separation.

As described above, it is very difficult to divide each semiconductor substrate into chips in the same desired form without causing chip breaking in the case where such semiconductor substrate is a nitride semiconductor substrate that is made of a nitride semiconductor device formed on a sapphire substrate or a SiC substrate or where it is a semiconductor substrate that is made of a semiconductor device, including a highly rigid material such as a low dielectric insulating film, formed on a sapphire substrate or a Sic Substrate. Thus, there is a call for technology for semiconductor substrate cleavage and chip separation that is capable of solving the above problems.

The following describes two conventional methods for dividing a semiconductor substrate as examples of the conventional arts.

FIG. 1A and FIG. 1B are an external view and a cross-sectional view, respectively, showing a conventional method for cleaving a nitride semiconductor substrate.

First, as shown in FIG. 1A, a GaN-based semiconductor laser element is formed by forming an epitaxial growth layer 13 on a sapphire substrate 7 using, for example, the MOCVD method. More specifically, such epitaxial growth layer 13 includes an n-type AlGaN cladding layer, an InGaN multi-quantum well active layer, and a p-type AlGaN cladding layer. The InGaN multi-quantum well active layer generates a violet laser oscillation at 405 nm. The p-type AlGaN cladding layer or the p-type GaN layer is formed as the surface of the epitaxial growth layer 13, and a patterned p-type ohmic electrode such as Ni/Au is formed on the p-type AlGaN cladding layer. An n-type ohmic electrode such as Ni/Al is formed on the n-type AlGaN cladding layer that has been exposed at the surface after selectively removing the p-type AlGaN cladding layer or the InGaN multi-quantum well active layer or on the n-type GaN layer that is formed below such n-type AlGaN cladding layer. Note that the sapphire substrate is taken as an example here, but the substrate may be a SiC substrate. Subsequently, the rear surface of the sapphire substrate 7 on which the epitaxial growth layer 13 is not formed is polished until the thickness of the sapphire substrate 7 becomes, for example, about 100 μm, and then scribe lines 15 are formed on the rear surface of the sapphire substrate 7 at intervals of the resonant length of the semiconductor laser element in the a axis direction (<11-20>direction) that is the direction in which the sapphire substrate 7 is to be cleaved. A diamond scriber 14 is used to form these scribe lines 15, each being a ditch with a depth of about 50 μm.

After the formation of the scribe lines 15, as shown in FIG. 1B, a bar-shaped nitride semiconductor substrate made up of plural semiconductor laser chips is formed by placing an edge jig 17 on each of the scribe lines 17 formed on the rear surface of the sapphire substrate 7 and then by applying pressure from the front surface of the epitaxial growth layer 13 using a jig 16. Then, semiconductor laser chips are obtained by repeatedly performing: the application of coating to the resulting cleaved facet 18 of the bar-shaped nitride semiconductor substrate for a better edge face reflectivity; and the above cleavage process to further divide the bar-shaped nitride semiconductor substrate.

FIG. 2 is an external view of a conventional chip separation method for semiconductor substrate.

First, as shown in FIG. 2, a GaN-based epitaxial growth layer 19 is formed on a sapphire layer 7 using, for example, the MOCVD method. This epitaxial growth layer 19 constitutes a light-emitting diode or a field-effect transistor integrated circuit. More specifically, in the case of constituting a light-emitting diode, it includes: an n-type GaN layer or an n-type AlGaN layer; an InGaN multi-quantum well active layer; and a p-type AlGaN layer or a p-type GaN layer. The InGaN multi-quantum well active layer emits a blue light of 470 nm by current injection. Meanwhile, in the case of constituting a field-effect transistor, an n-type AlGaN layer is formed on an undoped GaN layer. Subsequently, the sapphire substrate 7 is made into a thin-film by means of polishing or the like after the completion of the device formation process such as the formation of an electrode. After this, as shown in FIG. 2, it is possible to perform chip separation by cutting the semiconductor substrate into squares in the x and y directions using a diamond blade 20.

SUMMARY OF THE INVENTION

However, the conventional method for dividing a semiconductor substrate has problems such as that there is a frequent occurrence of chip breaking and chips cannot be cut in the same square-like form since such conventional method, in any cases shown in FIG. 1A, FIG. 1B, and FIG. 2, requires the formation of ditches on the semiconductor substrate using a diamond scriber or the like, or requires the cutting of the semiconductor substrate. Furthermore, since chip separation by means of cutting with a diamond blade requires a room for a chip width to be cut by the diamond blade, there is also a problem that a total number of chips obtained from one substrate is decreased and the cost of chips is increased. Furthermore, since it is difficult to obtain a flat cleaved facet when performing cleavage to form a resonator of a semiconductor laser element, there is a problem that the threshold current of the semiconductor laser element becomes higher and the process yield becomes worse.

In view of the above technical problems, it is an object of the present invention to provide a method for dividing a substrate that is (i) applicable to a cleavage method and a chip separation method for a semiconductor substrate, (ii) capable of dividing each substrate into chips in the same square-like form without causing chip breaking, and (iii) capable of forming all cleaved facets flat.

In order to achieve the above object, the method for dividing a substrate according to the present invention has a structure in which an electron beam is irradiated to the substrate along a division line so that the projected range of such electron beam is inside the substrate, and the surface side of the substrate that is within the projected range of the electron beam is heated by the irradiation of the electron beam. Since thermal expansion occurs in the heated part, i.e., the lattice constant of the heated part in the substrate becomes larger, it becomes possible to cleave the substrate utilizing such lattice mismatch. It is considered that the power density of the electron beam at which cleavage begins to occur is equivalent to the power density at which the projected range and the critical film thickness at which a crystal defect begins to be generated, becomes equal to each other. Furthermore, in order to cause cleavage, it is necessary that the power density w1 at which a crystal defect is generated is smaller than the power density w2 at which the substrate dissolves. It is possible to cause cleavage in the case where the substrate is irradiated by an electron beam with an electron density that is higher than w1 and lower than w2 under the above condition. In this case, the following is preferable in order to perform cleavage under a wider scope of beam irradiation condition: select a substrate made of a material that is hard to dissolve as a substrate; select a substrate made of a material whose thermal expansion coefficient is large as a substrate; make big a difference between the temperatures of a part not irradiated by an electron beam and a part irradiated by the electron beam by cooling the substrate.

With the above structure, that is to say, by scanning the front surface of the substrate by an electron beam under the above-described beam irradiation condition, it becomes possible to divide each substrate into chips in the same square-like form and to form all cleaved facets flat.

More specifically, the method for dividing a substrate according to the present invention is a method for dividing a substrate, including irradiating, to a front surface of the substrate, an electron beam with an intensity to generate a dislocation inside the substrate, so as to cause a crack triggered by the dislocation and to divide the substrate. Stated another way, in the method for dividing a substrate according to the present invention, an electron beam is irradiated from the side of the front surface of the substrate, the inside of the substrate is heated along the path of the electron beam that starts from the point on the front surface of the substrate from which the electron beam has come into the substrate, and a dislocation is generated at a part in the rear surface side of the substrate that is located beyond the projected range. Here, it is preferable that a projected range of the electron beam is greater than a depth, in a depth direction of the substrate, from the front surface to an interface between two parts which have different temperatures and at which a crystal defect begins to be generated.

With the above structure, since a part that is within the range from the front surface of the substrate to the end of the projected range is heated and the front surface side of the substrate expands thermally as a result, a lattice mismatch becomes big between a heated part and an unheated part that is beyond the projected range, and a crack occurs at the point in time when the film thickness of the heated part exceeds the critical film thickness, and the substrate is divided as a result. Accordingly, it becomes possible to divide a substrate at low cost and at high yields since (i) resistance to chip breaking is high, (ii) the shape of chips of each substrate is controlled to be in the same form, and (iii) it is possible to obtain a larger number of chips from one substrate without any breaking of scribed parts on the substrate and a thin film layer. Furthermore, it is possible to form all cleaved facets flat.

Furthermore, it is preferable that the substrate includes an insulating substrate and a metal film formed on the insulating substrate, and the above irradiating includes irradiating the electron beam to the metal film. Stated another way, it is preferable to use an insulating substrate as the substrate, to form a metal film on the front surface side of the substrate before the irradiation of the electron beam, and to irradiate the electron beam to the metal film from the front surface side.

With this preferable structure, it becomes possible to irradiate the electron beam in linear shape in a reproducible manner since static electrification does not occur at the substrate surface and therefore no bending of the electron beam occurs even when the substrate is an insulating substrate. Accordingly, it becomes possible to divide each substrate into chips in the same square-like form.

Furthermore, it is preferable that a projected range of the electron beam in the substrate is greater than the thickness of the metal film.

With this preferable structure, a crack occurs not in the metal film but in the substrate. Accordingly, it becomes possible to perform substrate division at low cost and at high yields that is capable of forming all cleaved facets flat.

Furthermore, it is preferable that the substrate further includes a semiconductor layer that is formed on a rear surface of the insulating substrate on which the metal film is not formed and that is made of a material different from a material of the insulating substrate. Stated another way, it is preferable to previously form, on the rear surface of the substrate to which the electron beam is irradiated, an epitaxial growth layer made of a material different from that of the substrate With this preferable structure, since it is possible to divide the substrate without irradiating an electron beam at the epitaxial growth layer side, it becomes possible to divide the substrate that includes the epitaxial growth layer without causing any thermal damages to the epitaxial growth layer.

Furthermore, it is preferable that the substrate includes a semiconductor layer, and the above irradiating includes irradiating the electron beam to the semiconductor layer. Stated another way, it is preferable that an epitaxial growth layer made of a material different from that of the substrate is previously formed on the front surface of the substrate, and that the electron beam is irradiated from the front surface side of such epitaxial growth layer.

With this preferable structure, it is possible to divide the substrate that includes the epitaxial growth layer on which a semiconductor device is formed, using the above irradiation of the electron beam.

Furthermore, it is preferable that the semiconductor layer is made of InGaAlN.

With this preferable structure, it becomes possible to perform, at low cost and at high yields, substrate division that is capable of forming all cleaved facets flat, the substrate division capable of being performed on the substrate that includes thereon the following: a superluminescent visible/ultraviolet light-emitting diode or ultraviolet semiconductor laser element which includes an InGaAlN quantum well structure as its light-emitting layer; a two-dimensional electron gas field-effect transistor using AlGaN/GaN; and an integrated circuit chip for such two-dimensional electron gas field-effect transistor Furthermore, it is preferable that the substrate includes a part that is made of one of SiC, sapphire, GaN, Si, GaAs, and InP.

With this preferable structure, it becomes possible to perform, at low cost and at high yields, substrate division that is capable of forming all cleaved facets flat, the substrate division capable of being performed on a highly rigid substrate such as a SiC substrate and a sapphire substrate or on a substrate that includes a semiconductor substrate such as a GaN substrate, a Si substrate, a GaAs substrate, and an InP substrate.

Furthermore, it is preferable that a projected range of the electron beam in the substrate is greater than the thickness of the semiconductor layer. Stated another way, it is preferable that the projected range of the electron beam is greater than the film thickness of the epitaxial growth layer.

With this preferable structure, since a crack occurs not in the epitaxial growth layer but in the substrate, it becomes possible to divide a substrate on which a semiconductor device is formed in a manner that a cleaved facet of the epitaxial growth layer and a cleaved facet of the substrate are the same.

Furthermore, it is preferable that the substrate includes a dielectric film whose relative dielectric constant is 3.9 or lower, and the above irradiating includes irradiating the electron beam to the dielectric film.

With this preferable structure, it becomes possible to perform chip separation in a highly linear manner without causing chip breaking, the chip separation having been difficult to perform in the case where a low dielectric interlayer insulating film is used in a Si integrated circuit for the purpose of reducing wiring delay.

Furthermore, it is preferable that the dielectric film is made of one of fluorine doped silicon glass, organic silicate glass, polyimide material, and porous resin material.

With this preferable structure, it becomes possible to perform, at low cost and at high yields, substrate division that is capable of forming all cleaved facets flat, the substrate division capable of being performed on a substrate that includes thereon a Si high-speed integrated circuit that uses, as its interlayer insulating film, a low dielectric film made of one of fluorine doped silicon glass (SiOF), organic silicate glass (SiOC), polyimide material, and porous resin material.

Furthermore, it is preferable that the above irradiating includes irradiating, to the dielectric film, an electron beam whose projected range in the substrate is greater than the thickness of the dielectric film, after irradiating, to the dielectric film, an electron beam whose projected range in the substrate is less than the thickness of the dielectric film.

With this preferable structure, it becomes possible to perform chip separation in a highly linear manner without causing chip breaking, the chip separation being performed on a Si integrated circuit chip including a low dielectric interlayer insulating film by scanning the substrate by an electron beam to form a division line on the low dielectric interlayer insulating film, and then scanning again the substrate by an electron beam with a greater projected range to cause a crack from inside the substrate to form a similar division line.

Here, it is preferable that the electron beam has a power density at which a dislocation is generated inside the substrate and at which the substrate does not dissolve. Stated another way, it is preferable to have a relationship $P1<P2$, where $P1$ is the power density of an electron beam at which a dislocation is generated in the substrate by the irradiation of the electron beam and $P2$ is the power density of an electron beam at which the substrate dissolves by the irradiation of an electron beam.

With this preferable structure, it becomes possible to cause a crack in the substrate without dissolving the substrate by the irradiation of the electron beam. Accordingly, it becomes possible to perform, at low cost and at high yields, substrate division that is capable of forming all cleaved facets flat.

Furthermore, it is preferable that the above irradiating includes irradiating the electron beam to the front surface of the substrate, while cooling a rear surface of the substrate.

With this preferable structure, since a part that is beyond the projected range is cooled, whereas a part irradiated by the electron beam expands thermally, it becomes possible to cause a crack, that is, perform cleavage at a lower electron density. Accordingly, since the electron density of an electron beam to be irradiated can be made lower, it becomes possible to divide the substrate without causing any thermal damages inside the substrate or to the semiconductor device formed on such substrate.

Furthermore, it is preferable that a semiconductor laser element is formed in the substrate.

Furthermore, it is preferable that a surface that serves as a resonator of the semiconductor laser element is formed by irradiating the electron beam.

With this preferable structure, since it is possible to create a mirror with a high reflectivity by forming a highly flat cleaved facet applicable as a resonator mirror of the semiconductor laser element and by applying coating to such cleaved facet, it is possible to achieve a semiconductor laser element with, for example, a low threshold current.

Furthermore, it is preferable that a strip-shaped substrate is divided into chips by irradiating the electron beam, the strip-shaped substrate having two cleaved facets and being made up of a plurality of semiconductor chips that are arranged in a bar-shaped form.

With this preferable structure, it becomes possible to divide each substrate in which a GaN-based semiconductor violet laser element is formed into chips in the same square-like form without causing chip breaking, in the case where cleavage is performed in the substrate first and then such substrate is divided at a facet that is off the cleaved facet by 30°.

Furthermore, it is preferable that the epitaxial growth layer includes a layer that forms a light-emitting diode.

With this preferable structure, it becomes possible to perform substrate division at low cost and at high yields that is capable of forming all cleaved facets flat by irradiating the electron beam, the substrate division capable of being performed on a substrate on which a light-emitting diode is formed.

Furthermore, it is preferable that the epitaxial growth layer or the substrate includes a transistor.

With this preferable structure, it becomes possible to perform substrate division at low cost and at high yields that is capable of forming all cleaved facets flat by irradiating the electron beam, the substrate division capable of being performed on a substrate on which a transistor or its integrated circuit is formed.

As described above, it is possible for the present invention to provide a method for dividing a substrate that is capable of dividing each substrate into chips in the same square-like form without causing chip breaking as well as capable of forming all cleaved facets flat. The present invention particularly makes it possible to divide each substrate into chips in the same square-like form without causing chip breaking and to form all cleaved facets flat in dividing a substrate that includes a rigid substrate, such as a sapphire substrate and a SiC substrate, and a nitride semiconductor device formed on such rigid substrate. What is more, since there hardly ever occurs breaking in a scribed line part on the substrate, it becomes possible to increase a total number of chips manufactured from one substrate and therefore to perform a manufacture process at low cost. Furthermore, it becomes also possible to easily divide a substrate including a highly rigid low dielectric film that is beginning to be used as a substrate for the state-of-the-art Si-LSI, by cleaving the Si substrate after causing cleavage inside the low dielectric film.

The disclosure of Japanese Patent Application No. 2004-169731 filed on Jun. 8, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

The following describes a method for dividing a substrate according to the preferred embodiments of the present invention with reference to the drawings.

First Embodiment

Figure 1A:
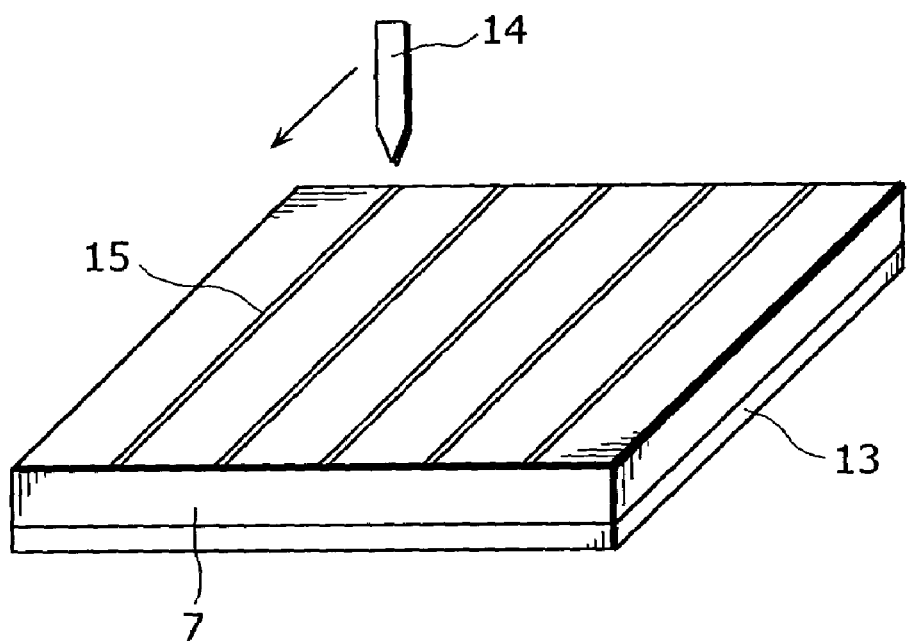
FIG. 1A is an external view showing a conventional method for cleaving a nitride semiconductor substrate.
Figure 1B:
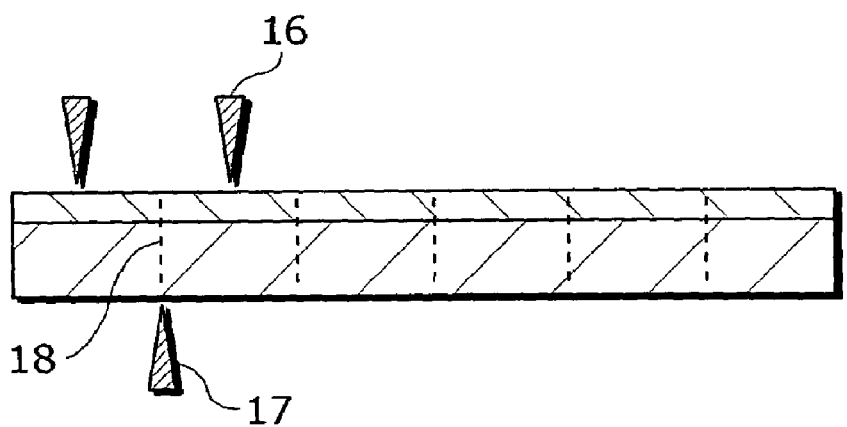
FIG. 1B is a cross-sectional view showing a conventional method for cleaving a nitride semiconductor substrate.
Figure 2:
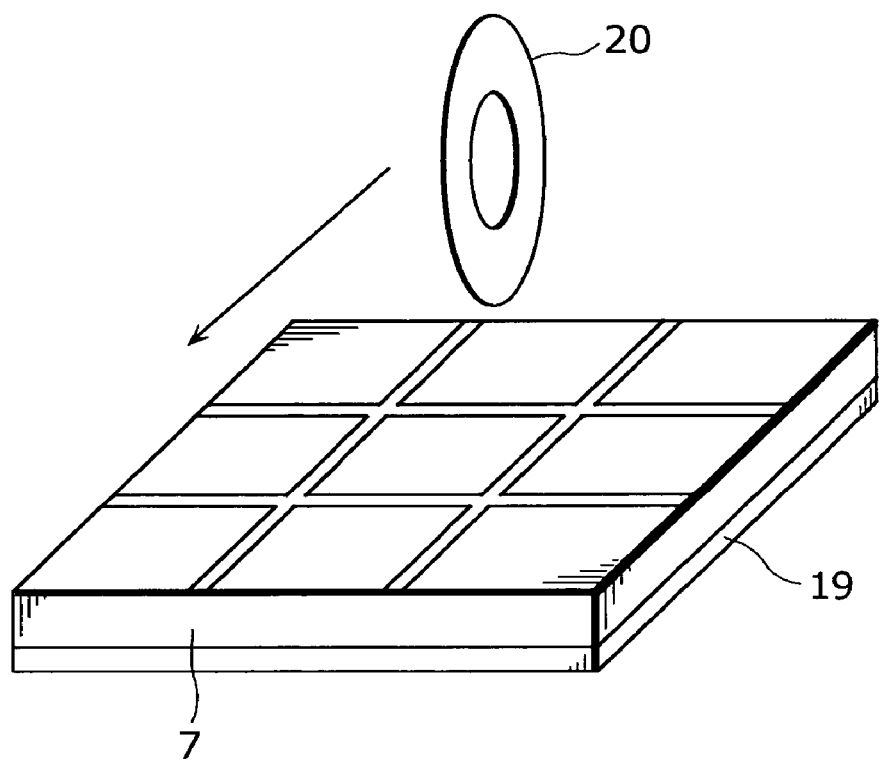
FIG. 2 is an external view showing a conventional chip separation method for a semiconductor substrate.
Figure 3:
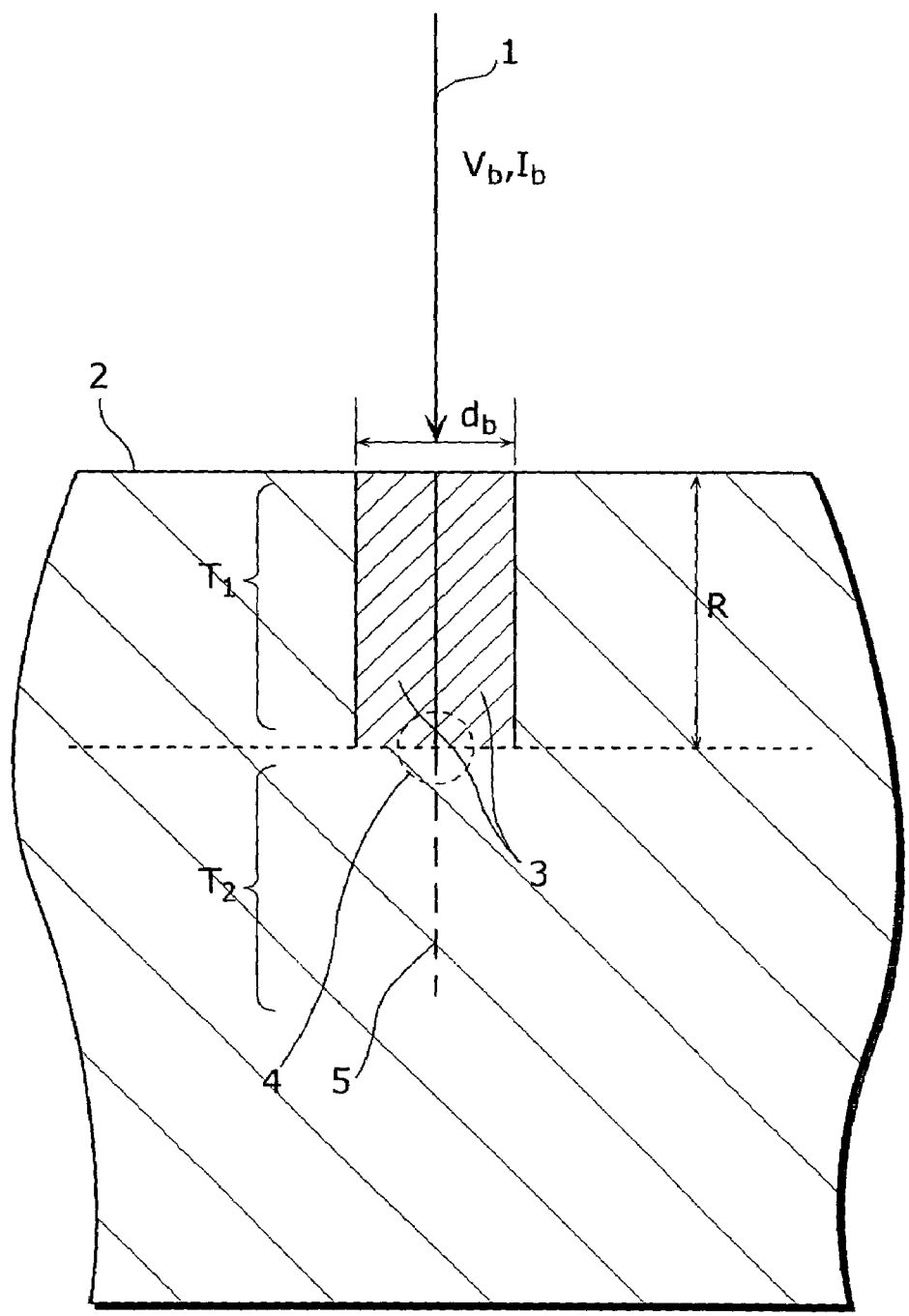
FIG. 3 is a cross-sectional view showing a method for cleaving a nitride semiconductor substrate according to a first embodiment of the present invention.

FIG. 3 is a cross-sectional view showing a method for cleaving a nitride semiconductor substrate according to the first embodiment of the present invention. Referring to FIG. 3 to FIG. 9, a description is given below of a condition for electron beam irradiation that allows all cleaved facets to be formed flat.

As shown in FIG. 3, an electron beam 1 is irradiated to a substrate surface 2 of a nitride semiconductor substrate under an irradiation condition made up of an acceleration voltage $V_b$, a beam current $I_b$, and an electron beam energy $E_b$. In this case, a beam radius that depends on the above irradiation condition is $d_b$. The electron beam 1 reaches the full depth of a projected range R from the substrate surface 2. This projected range R is defined by the depth from the substrate surface 2 to the position at which the electron strength becomes 0. In this case, since the acceleration voltage of the electron beam 1 to be irradiated is a relatively low acceleration voltage of MeV or lower, it is considerable that most of the energy loss of the electron beam 1 in the substrate is caused by impact. It is experimentally known that relationships represented by the following equations are given, taking the density of materials that make up the substrate is ρ (This is described on p. 303 in "*Denshi/Ion Beam Handobukku* (Electron/Ion Beam Handbook)".

Another reference is: L. Katz and A. S. Penfold Rev. Mod. Phys. 31(1959)920):

$$R\rho = 412 E_b{}^n$$

$$n = 1.265 - 0.0954 \ln E_b$$

Figure 4:
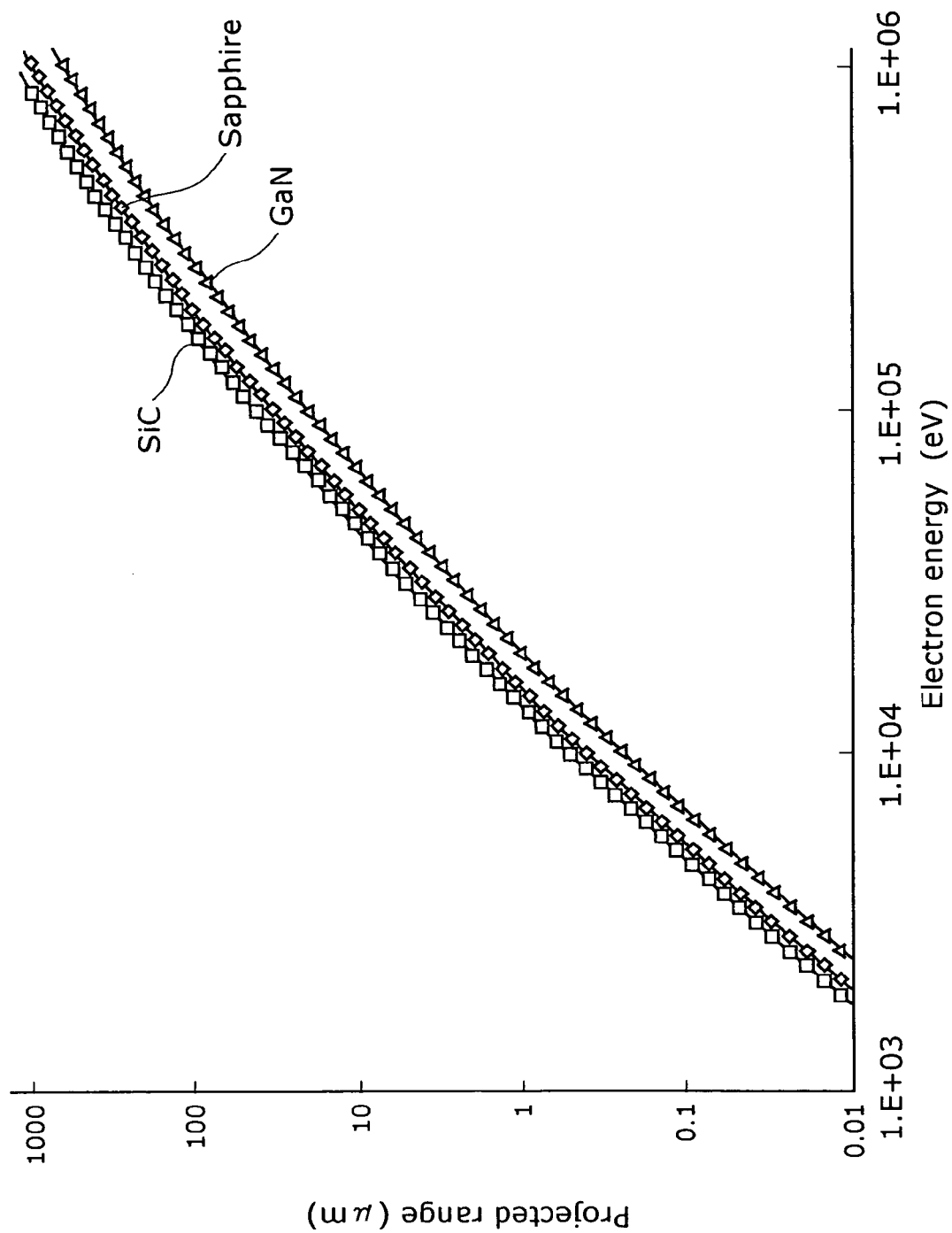
FIG. 4 is a diagram showing a dependence of a projected range on an electron beam acceleration voltage according to the first embodiment of the present invention.

Note that $E_b$ is represented in the unit of Mev. The above equations give the dependence of the projected range R on the electron beam acceleration voltage in each type of substrate as shown in FIG. 4. In FIG. 4, "Δ", "◇", and "☐" denote the dependences of the projected range R on the electron beam acceleration voltage in the GaN substrate, the sapphire substrate, and the SiC substrate, respectively. Also in FIG. 4, "1.E+03", "1.E+04", ... denote $1 \times 10^3$, $1 \times 10^4$, ..., respectively.

Figure 5:
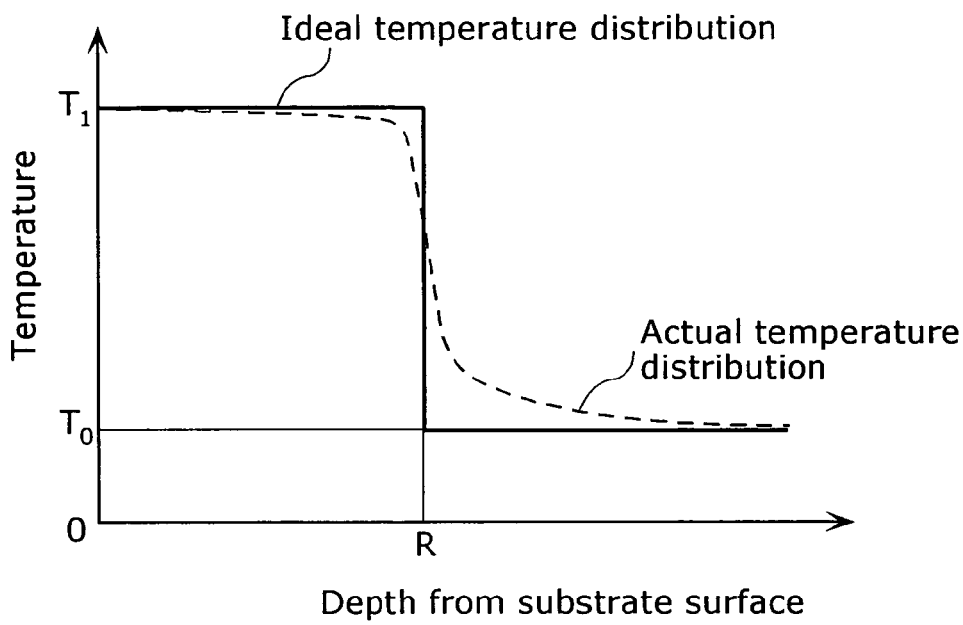
FIG. 5 is a diagram showing a temperature distribution in a depth direction in a substrate at the time of irradiating an electron beam according to the first embodiment of the present invention.

In the substrate, an area 3 to which the electron beam 1 has been irradiated is heated up to a temperature T1, whereas an unheated area located at a position deeper than the projected range R, to which the electron beam 1 has not been irradiated, has a temperature T2 that is different from the temperature T1. As a result, the temperature distribution in the substrate becomes as shown in FIG. 5. In FIG. 5, the solid line indicates an ideal temperature distribution characterized by a stepwise distribution, and the dotted line indicates the actual temperature distribution that is obtained by taking into account the intensity distribution of the electron beam and thermal diffusion. As a result of such temperature distribution established in the substrate, a crystal defect such as a dislocation is generated at a part 4 in the substrate due to the difference between lattice constants of two parts that are located across a certain interface, and then bonded atoms are separated, i.e., cleavage occurs. As a result, a cleaved facet 5 is formed. This is attributable to the fact that parts with different lattice constants are formed inside the substrate. That is to say, while the lattice constant of a heated part in the substrate becomes large due to thermal expansion of the lattice, the lattice constant of an unheated part remains the same as that determined by the temperature of the substrate at the time of electron beam irradiation. Here, in the case where a thin-film layer having a lattice constant different from that of the substrate is formed in the substrate, the film thickness of the thin film layer at which a crystal defect begins to be generated at the interface between the substrate and such thin-film layer, i.e., the film thickness known as "clinical film thickness", is calculated using the following equation defined by Matthews et al. (J. W. Matthews and A. E. Blakeslee, Journal of Crystal Growth 27 (1974) pp. 118-125):

$$h_c = \frac{a_1}{\sqrt{2}\pi f} \frac{1 - \frac{v}{4}}{1 + v}\left(\ln\frac{h_c\sqrt{2}}{a_2} + 1\right)$$

In this equation, hc denotes the critical film thickness, $a_1$ denotes the lattice constant of the thin-film layer, $a_2$ denotes the lattice constant of the substrate, f denotes a lattice mismatch ($=|(a_2-a_1)/a_1|$), and υ denotes the Poisson ratio of the thin-film layer. Thus, taking that the critical film thickness $h_c$ is the thickness of a heated part when a crystal defect is generated and cleavage begins in the substrate, i.e., the projected range R of an electron beam, and that a difference in the lattice constants is generated at a temperature difference T1-T2, the projected range R of the electron beam when cleavage begins is given by the following equation:

$$R = \frac{a}{\sqrt{2}\pi f} \frac{1 - \frac{v}{4}}{1 + v}\left(\ln\frac{R\sqrt{2}}{a(1 + \alpha(T_1 - T_2))} + 1\right)$$

In this equation, a denotes the thermal expansion coefficient of the substrate and a denotes the lattice constant of the substrate. It is known from the above equation that, in order to cause cleavage, it is necessary to heat the front surface of the substrate by electron beam irradiation so that a lattice mismatch becomes sufficiently big and the projected range R of the electron beam consequently becomes greater than the critical film thickness $h_c$.

Meanwhile, some kinds of substrate are discomposed and dissolved by the heat generated by electron beam irradiation. For example, since a GaN substrate decomposes at 900° C. or higher, it is necessary that T1 is lower than 900° C. in order to give the above R. Thus, in order to cause cleavage in the substrate, a condition for electron beam irradiation is set such that T1 is lower than the decomposition temperature of the substrate and is higher than the temperature at which dislocation is generated in the substrate.

Figure 6:
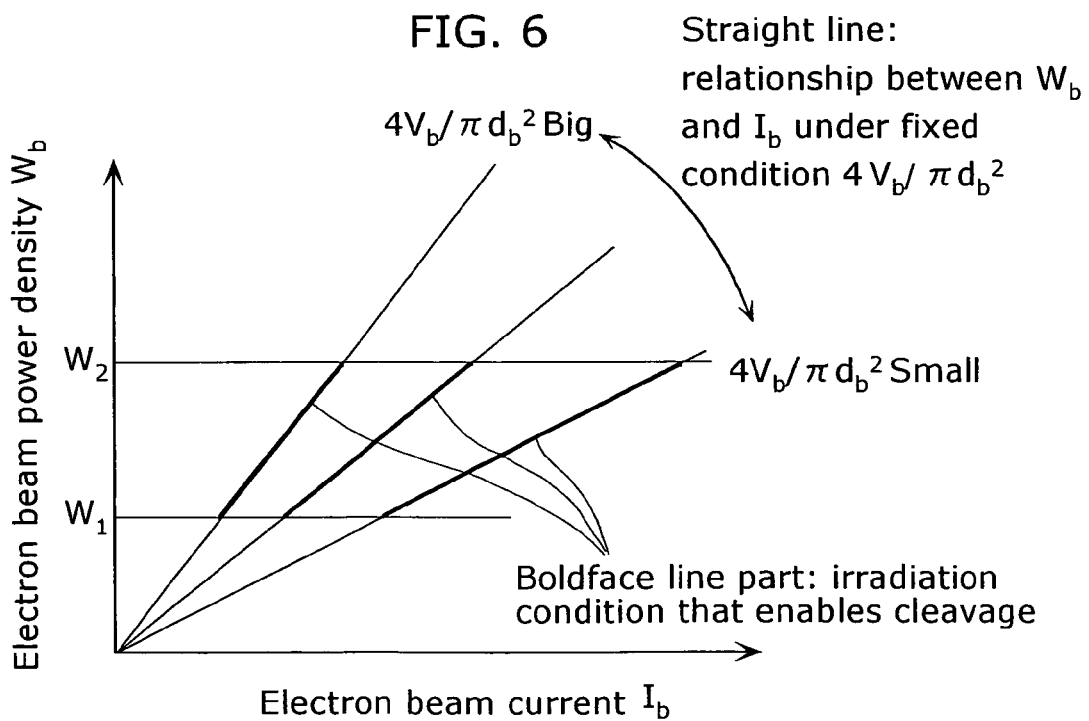
FIG. 6 is a diagram showing a power density range of an electron beam for causing cleavage according to the first embodiment of the present invention.
Figure 7:
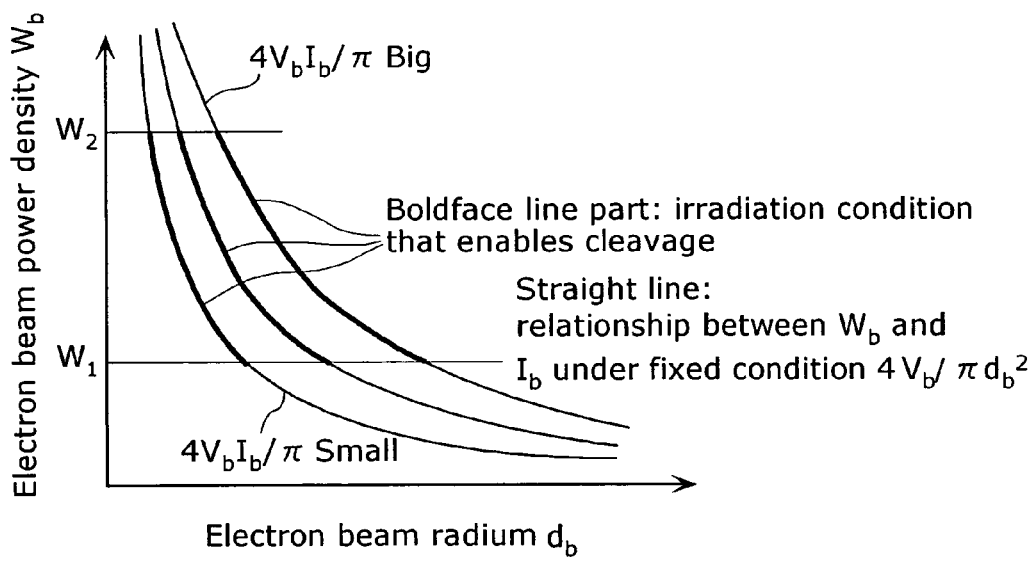
FIG. 7 is a diagram showing a power density range of an electron beam for causing cleavage according to the first embodiment of the present invention.

FIG. 6 and FIG. 7 are diagrams graphically showing conditions for electron beam irradiation for causing cleavage. The power density $w_b$ of an electron beam is given as follows:

$$w_b = 4V_b I_b|\pi d_b{}^2$$

In this equation, $V_b$ denotes the acceleration voltage of the electron beam, $I_b$ denotes the beam current of the electron beam, and $d_b$ denotes the beam radius of the electron beam. Based on the above equation, taking that $V_b$ is a fixed value, the power density range of the electron beam that causes cleavage is as illustrated in FIG. 6 and FIG. 7, using $I_b$ and $d_b$ as parameters, respectively. In these drawings, $w_2$ denotes the power density at which the substrate begins to dissolve, and $w_1$ denotes the power density at which dislocation beings. Also in these drawings, a beam irradiation condition represented by a boldface line denotes a beam irradiation condition that causes substrate cleavage. It is known from FIG. 6 and FIG. 7 that the following is effective in order to perform cleavage under a wider scope of beam irradiation condition: select a material that is hard to dissolve as a substrate material; select a material whose thermal expansion coefficient is large as a substrate material; make big a difference between the temperatures of a part not irradiated by an electron beam and a part irradiated by the electron beam at the time of electron beam irradiation by, for example, cooling the rear surface of the substrate. It is confirmed by the result of an experiment, in which an electron beam is irradiated to a substrate that is hard to dissolve (e.g., a sapphire substrate and a SiC substrate), that cleavage occurs when the substrate is kept at room temperature, and the acceleration voltage is set to 60 kV, the beam current is set to 15 mA, and the beam irradiation time is set to 50 msec. Such condition is included in the above described power density range.

Here, the minimum beam radius $d_b$, in the case where the space-charge effect at the time of electron beam irradiation can be ignored and where the spherical aberration of the lens and the thermal initial velocity are taken into account, is given by the following equation, where $c_o$ is a constant:

$$d_b = \left(\frac{I_b}{c_0 V_b}\right)^{3/8}$$

The power density $w_b$ that satisfies this relationship is as follows:

$$W_b = 4 C_0^{3/4} I_b^{1/4} V_b^{7/4} \pi$$

Figure 8:
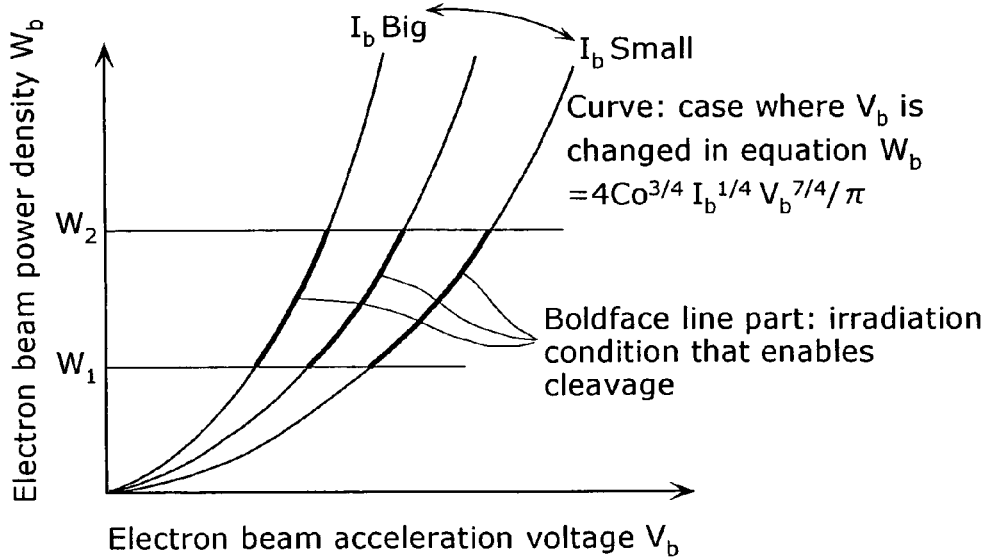
FIG. 8 is a diagram showing a power density range of an electron beam for causing cleavage in the case where a condition for irradiating the electron beam is set so that the beam radius of the electron beam becomes minimum, according to the first embodiment of the present invention.
Figure 9:
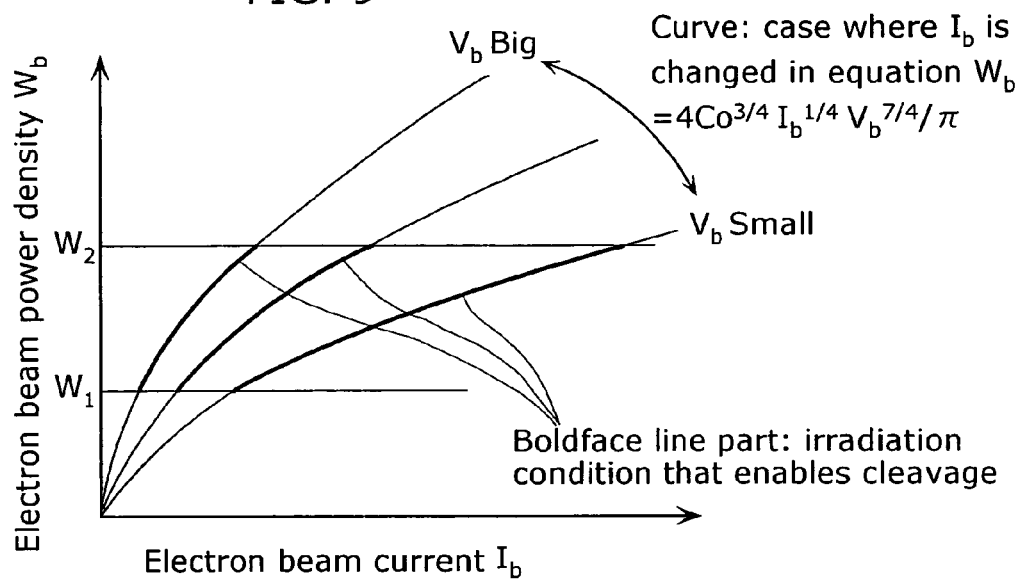
FIG. 9 is a diagram showing a power density range of an electron beam for causing cleavage in the case where a condition for irradiating the electron beam is set so that the beam radius of the electron beam becomes minimum, according to the first embodiment of the present invention.

FIG. 8 and FIG. 9 are diagrams showing, based on this relationship, the power density ranges of electron beam shown in FIG. 6 and FIG. 7 that cause cleavage, as functions of the acceleration voltage and the beam current of an electron beam, respectively, under a condition for achieving the minimum beam radius. In these drawings too, a beam irradiation condition represented by a boldface line denotes a beam irradiation condition that causes substrate cleavage.

As described above, according to the method for cleaving a nitride semiconductor substrate according to the present embodiment, the substrate surface is scanned by an electron beam that satisfies any of the beam irradiation conditions represented by the boldface lines in FIG. 6 to FIG. 9, so as to irradiate an electron beam. Accordingly, since a crack occurs in the substrate by being triggered by a crystal defect such as a dislocation and a cleaved facet is formed as a result, it is possible to provide a method for cleaving a nitride semiconductor substrate that is capable of forming all cleaved facets flat.

Note that the invention according to the present embodiment is also applicable to the chip separation of a strip-shaped substrate which has two cleaved facets and which is made up of plural semiconductor laser elements that are arranged in a bar-shaped form.

Second Embodiment

Figure 10:
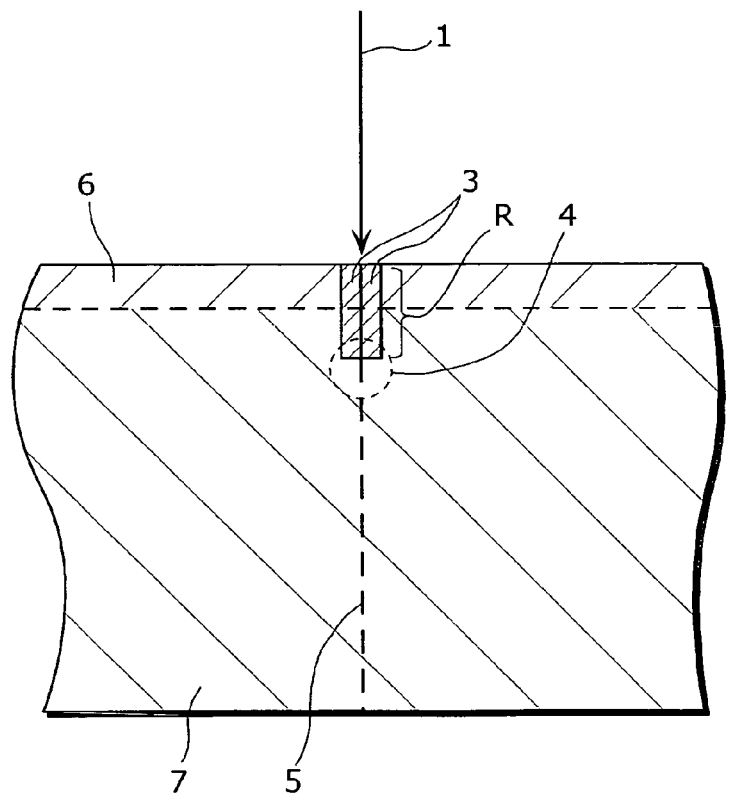
FIG. 10 is a cross-sectional view showing a method for cleaving a nitride semiconductor substrate according to a second embodiment of the present invention.

FIG. 10 is a cross-sectional view showing a method for cleaving a nitride semiconductor substrate according to the second embodiment of the present invention.

As shown in FIG. 10, an electron beam 1 is irradiated to the front surface of a nitride semiconductor substrate made up of a sapphire substrate 7 and a GaN-based semiconductor thin film 6 formed on such sapphire substrate 7. The GaN-based semiconductor thin film 6 forms, for example, a semiconductor laser element or a light-emitting diode. Note that an electrode or the like may be previously formed on the GaN-based semiconductor thin film 6. The present embodiment has a structure in which the projected range R of the electron beam 1 reaches inside the sapphire substrate 7 located under the GaN-based semiconductor thin film 6 and cleavage as described in the first embodiment starts from the sapphire substrate 7. Although there occurs a crack in the GaN-based semiconductor thin film 6 even in the case where the electron beam 1 does not go inside the sapphire substrate 7 due to a low acceleration voltage of such electron beam 1, it is difficult to perform cleavage further to the sapphire substrate 7. Therefore, by setting a beam irradiation condition such that the projected range R becomes greater than the film thickness of the GaN-based semiconductor thin film 6, an area 3 to be irradiated by the electron beam 1 reaches as far as the sapphire substrate 7. Accordingly, since a crystal defect such as a dislocation is generated at a part 4 in the sapphire substrate 7 and a cleaved facet 5 is formed as a result, it becomes possible to cleave the sapphire substrate 7 and the GaN-based semiconductor thin film 6 to form all cleaved facets flat. Here, the substrate that includes the sapphire substrate is taken as an example, but the present embodiment is also applicable to the cleavage of a substrate that includes a SiC substrate or a Si substrate as long as an electron beam is irradiated under any of the beam irradiation conditions shown in FIG. 6 to FIG. 9.

Third Embodiment

Figure 11:
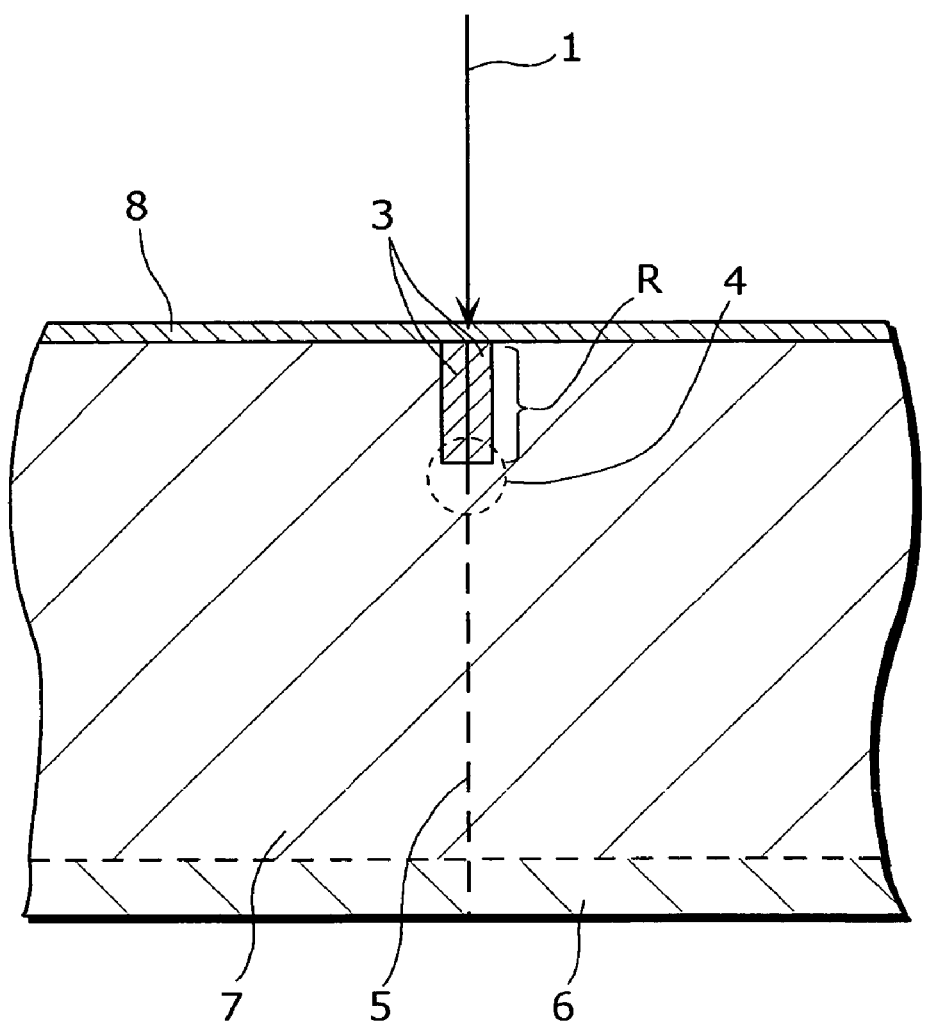
FIG. 11 is a cross-sectional view showing a method for cleaving a nitride semiconductor substrate according to a third embodiment of the present invention.

FIG. 11 is a cross-sectional view showing a method for cleaving a nitride semiconductor substrate according to the third embodiment of the present invention.

As shown in FIG. 11, an electron beam 1 is irradiated to the front surface of a nitride semiconductor substrate made up of a sapphire substrate 7 and a GaN-based semiconductor thin film 6 formed on such sapphire substrate 7. The GaN-based semiconductor thin film 6 forms, for example, a semiconductor laser element or a light-emitting diode. Note that an electrode or the like may be previously formed on the GaN-based semiconductor thin film 6. The electron beam 1 is irradiated from the front surface of the GaN-based semiconductor thin film 6 in the second embodiment, but the present embodiment has a structure in which the nitride semiconductor substrate is cleaved by irradiating the electron beam 1 from the side of the sapphire substrate 7. Since the electron beam 1 is not irradiated from the side of the GaN-based semiconductor thin film 6, there is no occurrence of, for example, the diffusion of dopant impurities such as Mg or the degradation of the GaN-based semiconductor thin film 6 such as the alteration in the composition of the InGaN-based multi-quantum well active layer. The sapphire substrate 7 is an insulating substrate, and there is therefore a concern about static electrification that occurs at the front surface of the sapphire substrate 7 and about the resulting bending of the electron beam 1. In order to address such concern, a metal thin film 8 that is made of Au or the like and that has a thickness of some 10 nm, for example, is formed on the rear surface of the sapphire substrate 7 on which the GaN-based semiconductor thin film 6 is not formed, and the electron beam 1 is to be irradiated to such metal thin film 8. The projected range R of the electron beam 1 to be irradiated is greater than the thickness of the metal thin film 8 and reaches inside the sapphire substrate 7, i.e., an area 3 irradiated by the electron beam 1 reaches the sapphire substrate 7. Accordingly, since a cleaved facet 5 is formed as a result of the generation of a crystal defect such as a dislocation at a part 4 in the sapphire substrate 7, cleavage as described in the first embodiment occurs in the sapphire substrate 7 in the present embodiment. This structure makes it possible to cleave the sapphire substrate 7 and the GaN-based semiconductor thin film 6 to form all cleaved facets flat and without causing the degradation of the GaN-based semiconductor thin film. Here, the substrate that includes the sapphire substrate is taken as an example, but the present embodiment is also applicable to the cleavage of a substrate that includes a SiC substrate or a Si substrate as long as an electron beam is irradiated under any of the beam irradiation conditions shown in FIG. 6 to FIG. 9. It should be also noted that there is no need to form the above-described metal thin film in the case where a conductive substrate is used instead of an insulating substrate such as a sapphire substrate.

Fourth Embodiment

Figure 12A:
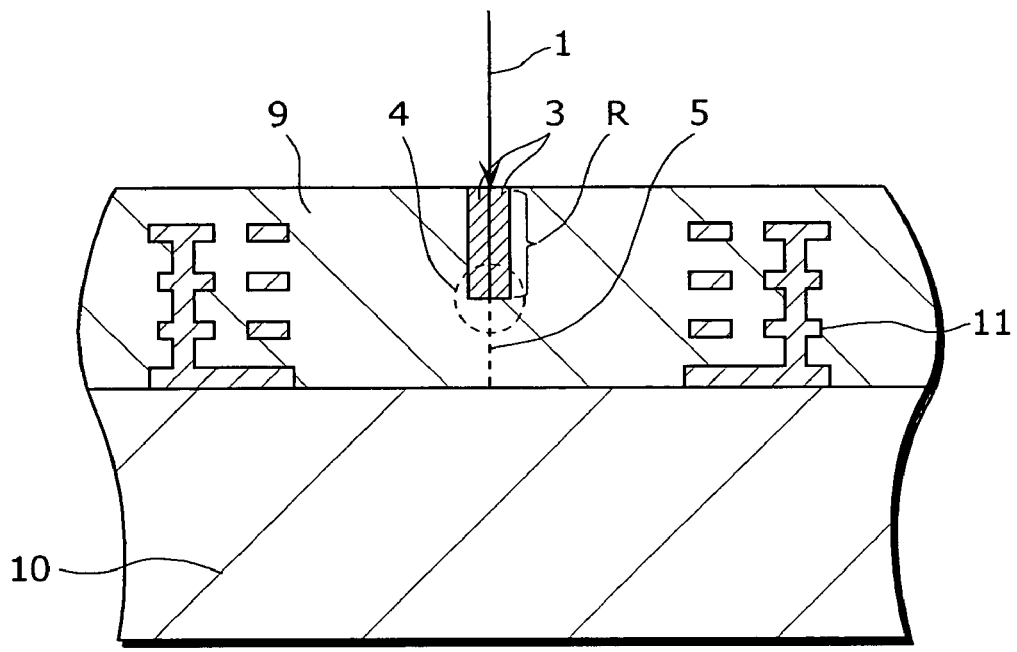
FIG. 12A is a cross-sectional view showing a chip separation method for a semiconductor substrate according to a fourth embodiment of the present invention.
Figure 12B:
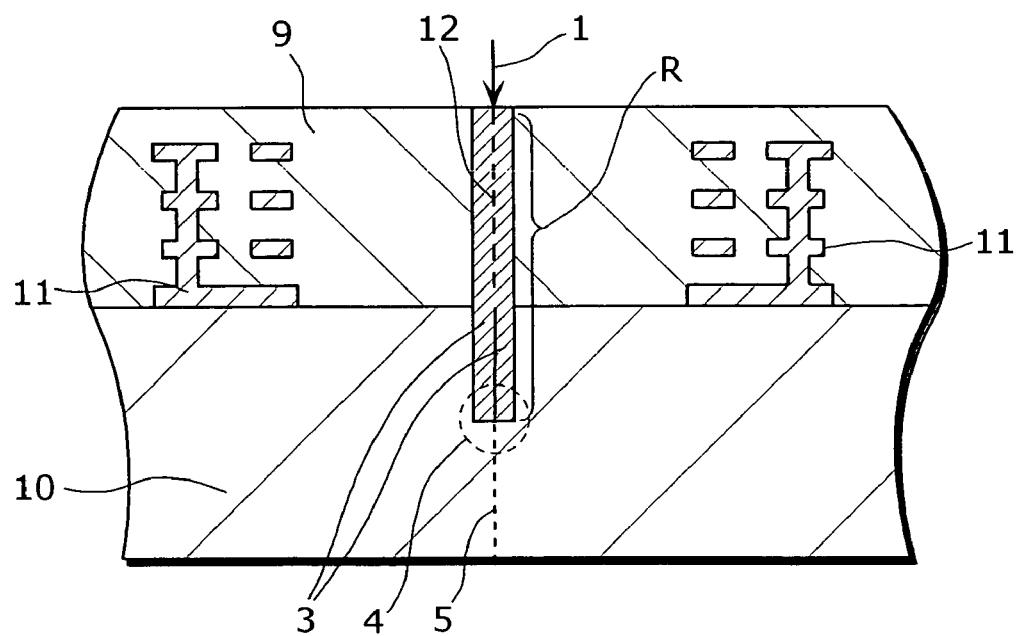
FIG. 12B is a cross-sectional view showing a chip separation method for a semiconductor substrate according to the fourth embodiment of the present invention.

FIG. 12A and FIG. 12B are cross-sectional views, each showing a chip separation method for a semiconductor substrate in which a Si integrated circuit is formed, according to the fourth embodiment.

As FIG. 12A and FIG. 12B show, the electron beam 1 is irradiated to the front surface of a semiconductor substrate that is made up of a Si substrate 10 and a Si integrated circuit, formed on such Si substrate 10, including a Cu wiring 11 and a low dielectric insulating film (known as a low-k film) made of, for example, SiOC (organic silicate glass) or SiLK (porous resin material developed by Dow Corning Co., Ltd). Here, a transistor or multilayer interconnection may be formed in the Si integrated circuit. In the present chip separation method for a substrate, the substrate is scanned at least twice with the electron beam 1 along each chip division line by changing the levels of the acceleration voltage of the electron beam 1 between two levels. More specifically, as shown in FIG. 12A, a condition for irradiating the electron beam 1 is set first such that the projected range R of the electron beam 1 is less than the film thickness of the low dielectric insulating film 9, and the substrate is scanned with the electron beam 1 under such condition. Accordingly, since an area 3 to be irradiated by the electron beam 1 does not reach the Si substrate 10, and thus a crystal defect such as a dislocation is generated at a part 4 in the low dielectric insulating film 9 and a cleaved facet 5 is formed as a result, meaning that a crack for chip separation occurs only in the low dielectric insulating film 9. After this, as shown in FIG. 12, a condition for irradiating the electron beam 1 is further set such that the projected range R of the electron beam 1 is sufficiently great, greater than the film thickness of the low dielectric insulating film 9, and the substrate is scanned with the electron beam 1 under such condition. Accordingly, since the area 3 to be irradiated by the electron beam 1 reaches the Si substrate 10, and thus a crystal defect such as a dislocation is generated at a part 4 in the Si substrate 10 and a cleaved facet 12 is formed as a result, meaning that a crack for chip separation occurs in the Si substrate. As a result, as in the case of the First to Third Embodiments, it is possible to form all cleaved facets flat by irradiating, to the substrate, the electron beam 1 that satisfies any of the beam irradiation conditions shown in FIG. 6 to FIG. 9. Here, irradiation of two levels of electron beam has been described, but it is also possible to perform substrate division in the similar manner by setting a sufficiently long projected range and only performing a process of cleaving the Si substrate, in the case where the low dielectric insulating film is sufficiently thin compared with the substrate.

As described above, according to the chip separation method for a semiconductor substrate according to the present embodiment, the substrate is scanned plural times by the electron beam 1 by changing the levels of its acceleration voltage. Accordingly, it becomes possible to provide a chip separation method for a semiconductor substrate that is capable of dividing each substrate into chips in the same squire-like form without causing chip breaking, even if such substrate includes a highly rigid material such as a low dielectric insulating film.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, the substrates used in the preferred embodiments shown in FIG. 3 to FIG. 12A and FIG. 12B may have any plane direction, and thus a plane direction for a representative plane with an off-angle can be used, i.e., the (0001) plane in the case of a sapphire substrate, the (100) plane and the (111) plane in the case of a Si substrate, for example. Furthermore, such substrates may be a GaAs substrate, an InP substrate, a SiC substrate and a GaN substrate. Moreover, the GaN-based semiconductor thin film may have any composition ratio of that of InGaAlN, and thus it may include, as its constituent element, a V-group element such as As and P or a III-group element such as B. Furthermore, a crystal growth method for the semiconductor film may be any of the MOCVD method, the molecular beam epitaxy (MBE) method, and the HVPE method, or may be a combination of two or more of these methods. What is more, the application of the present invention is not limited to a nitride semiconductor substrate, and thus it may be applied as a cleavage method and a chip separation method for a substrate on which any of the following is formed: a semiconductor laser element that uses a III-V group compound semiconductor such as GaAs and InP; a light-emitting diode; and a field-effect transistor integrated circuit. Moreover, SiOC and SiLK and the like are presented as exemplary materials making up the low dielectric insulating film, but the present invention is not limited to them as long as the relative dielectric constant of materials is 3.9 or lower, which is lower than the relative dielectric constant of $SiO_2$. Therefore, SiOF (fluorine doped silicon glass) and polyimide materials may be the materials of the low dielectric insulating film.

INDUSTRIAL APPLICABILITY

The present invention, which is applicable to a method for dividing a substrate, is highly useful since it is applicable particularly to a manufacture method of: a semiconductor laser element for high-density optical disc made of a nitride semiconductor; a variety of light-emitting diodes for display or lighting purposes; a field-effect transistor integrated circuit for high-frequency communications or a high-power field-effect transistor integrated circuit; and a very high speed Si integrated circuit.

What is claimed is:

1. A method for dividing a substrate, comprising
irradiating, to a front surface of the substrate, an electron beam with an intensity to generate a dislocation inside the substrate, so as to cause a crack triggered by the dislocation and to divide the substrate,
wherein said irradiating includes irradiating the electron beam to the front surface of the substrate, while cooling a rear surface of the substrate.

2. The method for dividing the substrate according to claim 1,
wherein the substrate includes an insulating substrate and a metal film formed on the insulating substrate, and
said irradiating includes irradiating the electron beam to the metal film.

3. The method for dividing the substrate according to claim 2,
wherein a projected range of the electron beam in the substrate is greater than the thickness of the metal film.

4. The method for dividing the substrate according to claim 3,
wherein the substrate further includes a semiconductor layer that is formed on a rear surface of the insulating substrate on which the metal film is not formed and that is made of a material different from a material of the insulating substrate.

5. The method for dividing the substrate according to claim 1,
wherein the substrate includes a semiconductor layer, and said irradiating includes irradiating the electron beam to the semiconductor layer.

6. The method for dividing the substrate according to claim 5,
wherein the semiconductor layer is made of InGaAlN.

7. The method for dividing the substrate according to claim 5,
wherein the substrate includes a part that is made of one of SiC, sapphire, GaN, Si, GaAs, and InP.

8. The method for dividing the substrate according to claim 5,
wherein a projected range of the electron beam in the substrate is greater than the thickness of the semiconductor layer.

9. The method for dividing the substrate according to claim 1,
wherein the substrate includes a dielectric film whose relative dielectric constant is 3.9 or lower, and
said irradiating includes irradiating the electron beam to the dielectric film.

10. The method for dividing the substrate according to claim 9,
wherein the dielectric film is made of one of fluorine doped silicon glass, organic silicate glass, polyimide material, and porous resin material.

11. The method for dividing the substrate according to claim 9,
wherein said irradiating includes irradiating, to the dielectric film, an electron beam whose projected range in the substrate is greater than the thickness of the dielectric film, after irradiating, to the dielectric film, an electron beam whose projected range in the substrate is less than the thickness of the dielectric film.

12. The method for dividing the substrate according to claim 1,
wherein a projected range of the electron beam is greater than a depth, in a depth direction of the substrate, from the front surface to an interface between two parts which have different temperatures and at which a crystal defect begins to be generated.

13. The method for dividing the substrate according to claim 1,
wherein the electron beam has a power density at which a dislocation is generated inside the substrate and at which the substrate does not dissolve.

14. The method for dividing the substrate according to claim 1,
wherein a semiconductor laser element is formed in the substrate.

* * * * *